(12) United States Patent
Lin et al.

(10) Patent No.: US 11,056,573 B2
(45) Date of Patent: Jul. 6, 2021

(54) IMPLANTATION AND ANNEALING FOR SEMICONDUCTOR DEVICE

(71) Applicant: Taiwan Semiconductor Manufacturing Company, Ltd., Hsinchu (TW)

(72) Inventors: Yu-Chang Lin, Hsinchu (TW); Tien-Shun Chang, New Taipei (TW); Szu-Ying Chen, Toufen Township (TW); Chun-Feng Nieh, Hsinchu (TW); Sen-Hong Syue, Zhubei (TW); Huicheng Chang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 10 days.

(21) Appl. No.: 16/441,487

(22) Filed: Jun. 14, 2019

(65) Prior Publication Data
US 2020/0395462 A1 Dec. 17, 2020

(51) Int. Cl.
| | |
|---|---|
| *H01L 29/76* | (2006.01) |
| *H01L 29/66* | (2006.01) |
| *H01L 27/092* | (2006.01) |
| *H01L 29/78* | (2006.01) |
| *H01L 21/8238* | (2006.01) |
| *H01L 21/265* | (2006.01) |
| *H01L 21/324* | (2006.01) |

(52) U.S. Cl.
CPC ...... *H01L 29/66545* (2013.01); *H01L 21/265* (2013.01); *H01L 21/324* (2013.01); *H01L 21/823821* (2013.01); *H01L 21/823828* (2013.01); *H01L 27/0924* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,577,102 | B1 * | 2/2017 | Hsiao .............. H01L 23/535 |
| 9,608,116 | B2 | 3/2017 | Ching et al. |
| 9,812,363 | B1 | 11/2017 | Liao et al. |
| 9,859,380 | B2 | 1/2018 | Lee et al. |
| 2015/0187939 | A1 * | 7/2015 | Wu ................ H01L 21/28114 257/412 |
| 2017/0207117 | A1 * | 7/2017 | Wang ............... H01L 23/5226 |
| 2018/0053844 | A1 | 2/2018 | Bi et al. |
| 2018/0151387 | A1 * | 5/2018 | Liu ................. H01L 21/31155 |

* cited by examiner

*Primary Examiner* — Hung K Vu
(74) *Attorney, Agent, or Firm* — Slater Matsil, LLP

(57) ABSTRACT

A semiconductor device, and a method of manufacturing, is provided. A dummy gate is formed on a semiconductor substrate. An interlayer dielectric (ILD) is formed over the semiconductor fin. A dopant is implanted into the ILD. The dummy gate is removed and an anneal is performed on the ILD. The implantation and the anneal lead to an enhancement of channel resistance by a reduction in interlayer dielectric thickness and to an enlargement of critical dimensions of a metal gate.

20 Claims, 21 Drawing Sheets

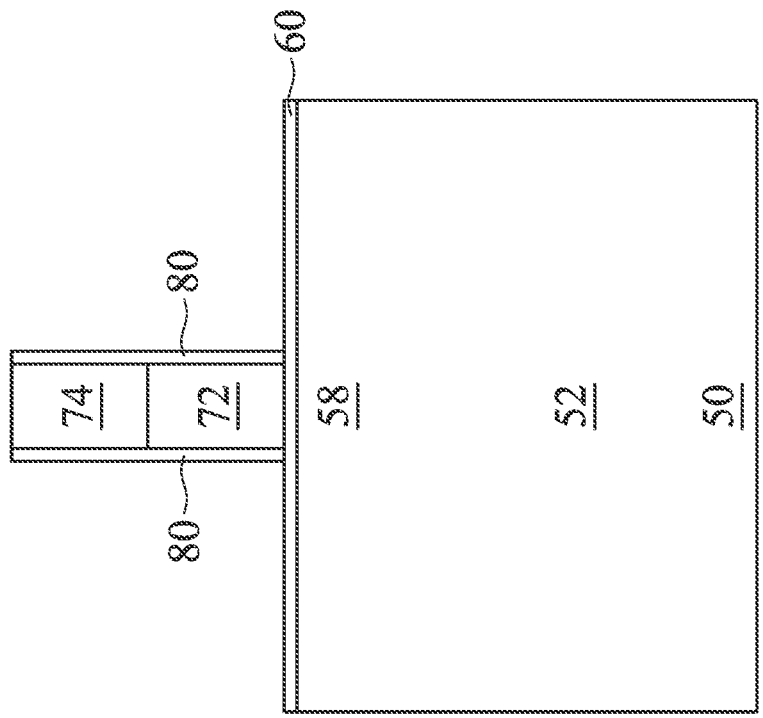
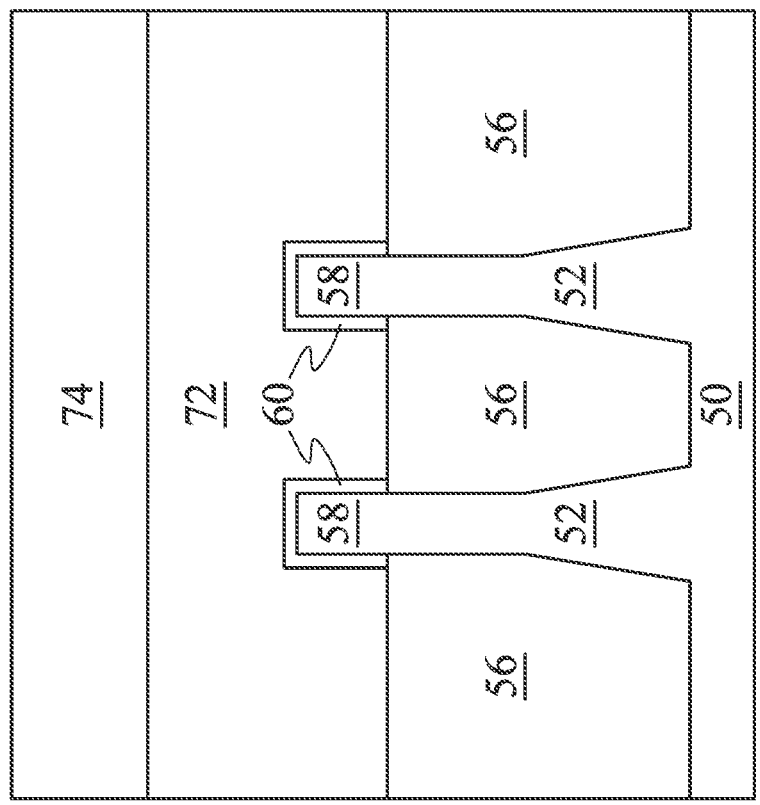
Figure 8A
Figure 8B

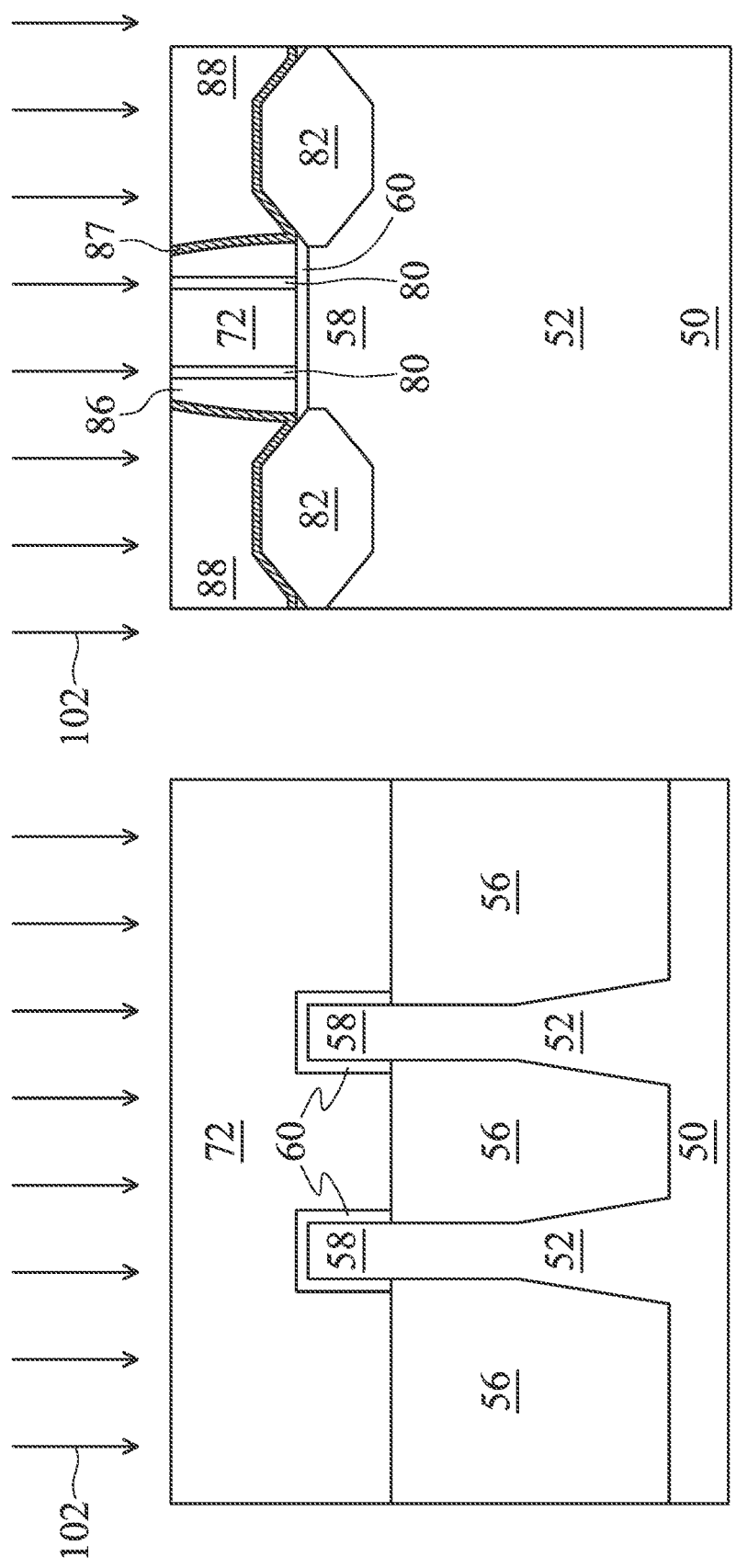

IMPLANTATION AND ANNEALING FOR SEMICONDUCTOR DEVICE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 13C, 14A, 14B, 15A, 15B, 16A, 16B, 16C, 16D, 17A, 17B, 18A, and 18B are cross-sectional views of intermediate stages in the manufacturing of FinFETs, in accordance with some embodiments.

DETAILED DESCRIPTION

Figure 1:
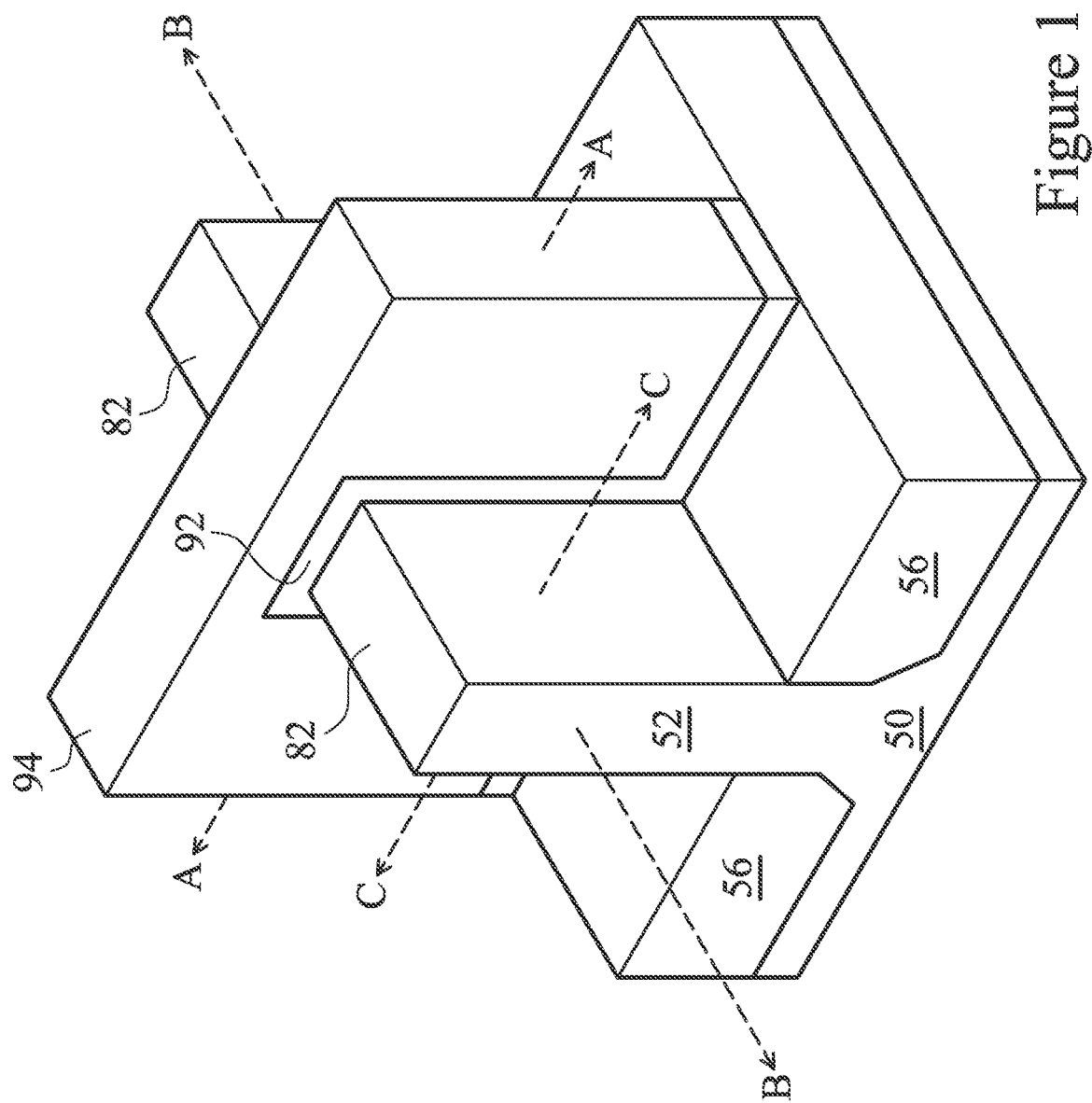
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Advantageous features of one or more embodiments disclosed herein may include enhancement of on current by reduction of gate dielectric thickness as well as enlargement of critical dimensions of the upper portions of gates, which enables the filling of gates with a greater amount of metallic material. Prior to the removal of a dummy gate, an implantation is performed on an interlayer dielectric (ILD) to reduce the amount of oxygen diffused into the ILD. After the removal of the dummy gate, an anneal is performed on the ILD to further reduce the oxygen diffusion into the ILD, decreasing the ILD thickness and enlarging the gate critical dimensions by strain engineering. With the enlarged gate critical dimensions, the gate may be filled with more metallic material.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 18B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 16A, 17A, and 18A are illustrated along reference cross-section A-A illustrated in FIG. 1, and FIGS. 8B, 9B, 10B, 11B, 12B, 13B, 14B, 15B, 16B, 16C, 16D, 17B, and 18B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
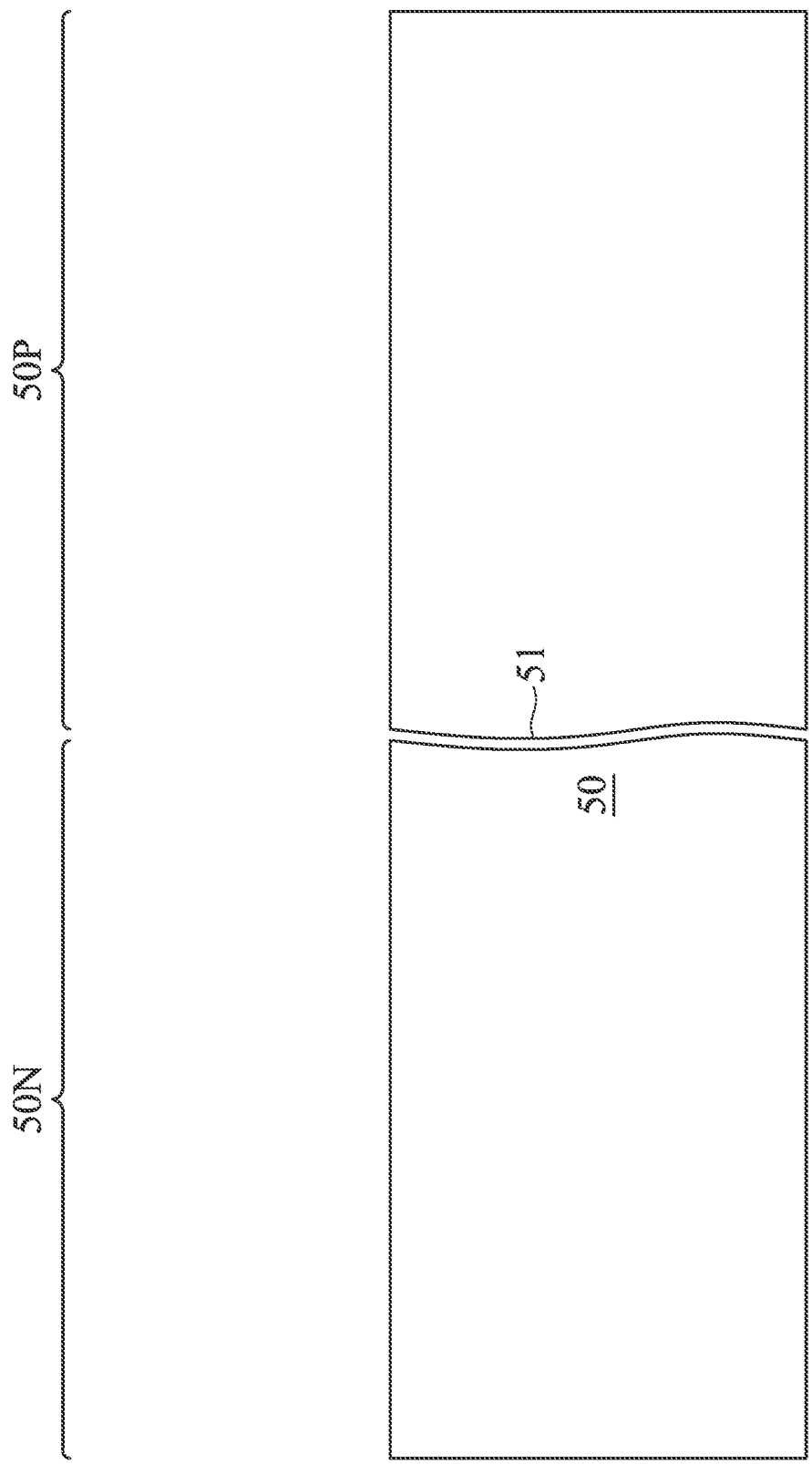

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
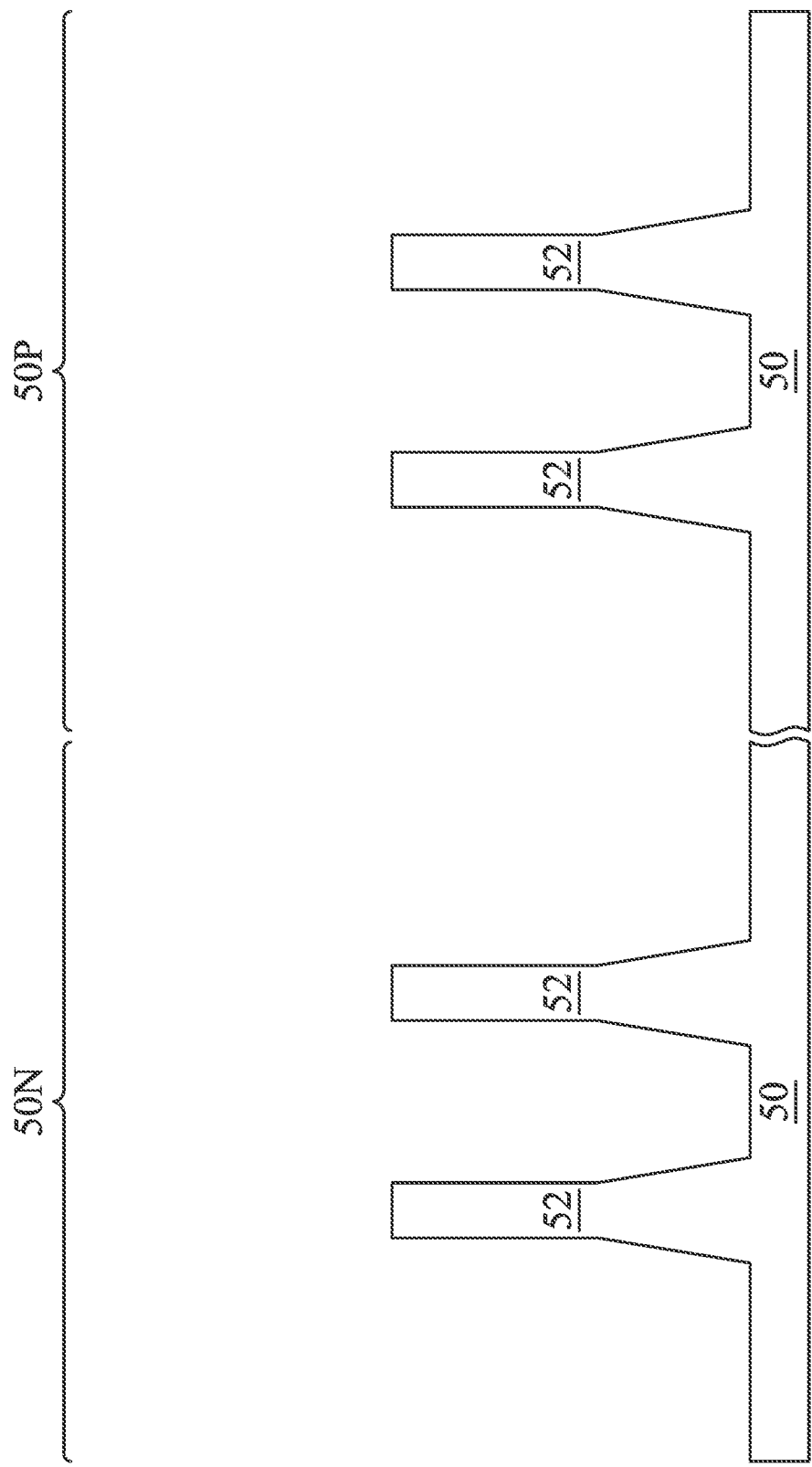

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
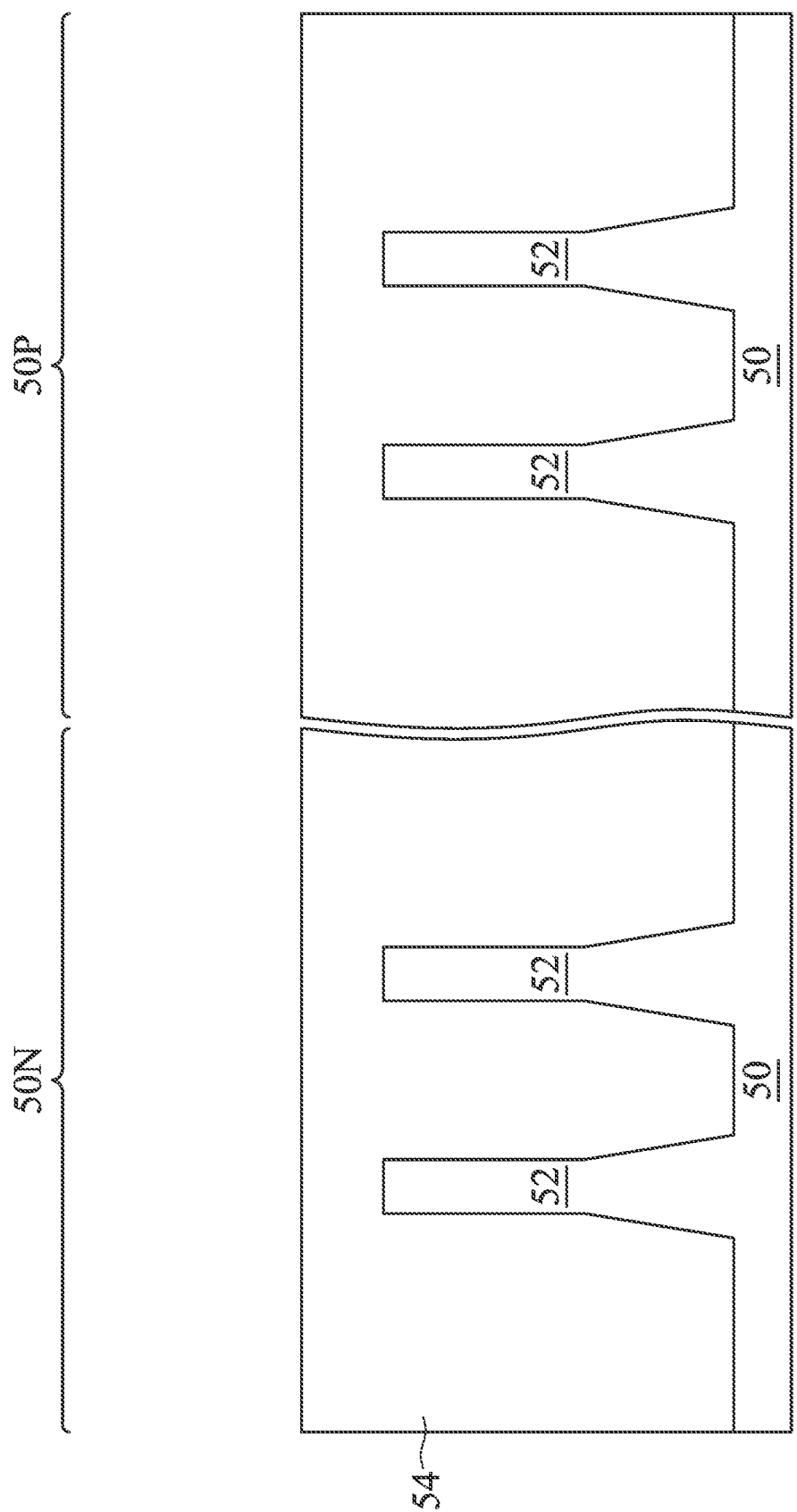

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
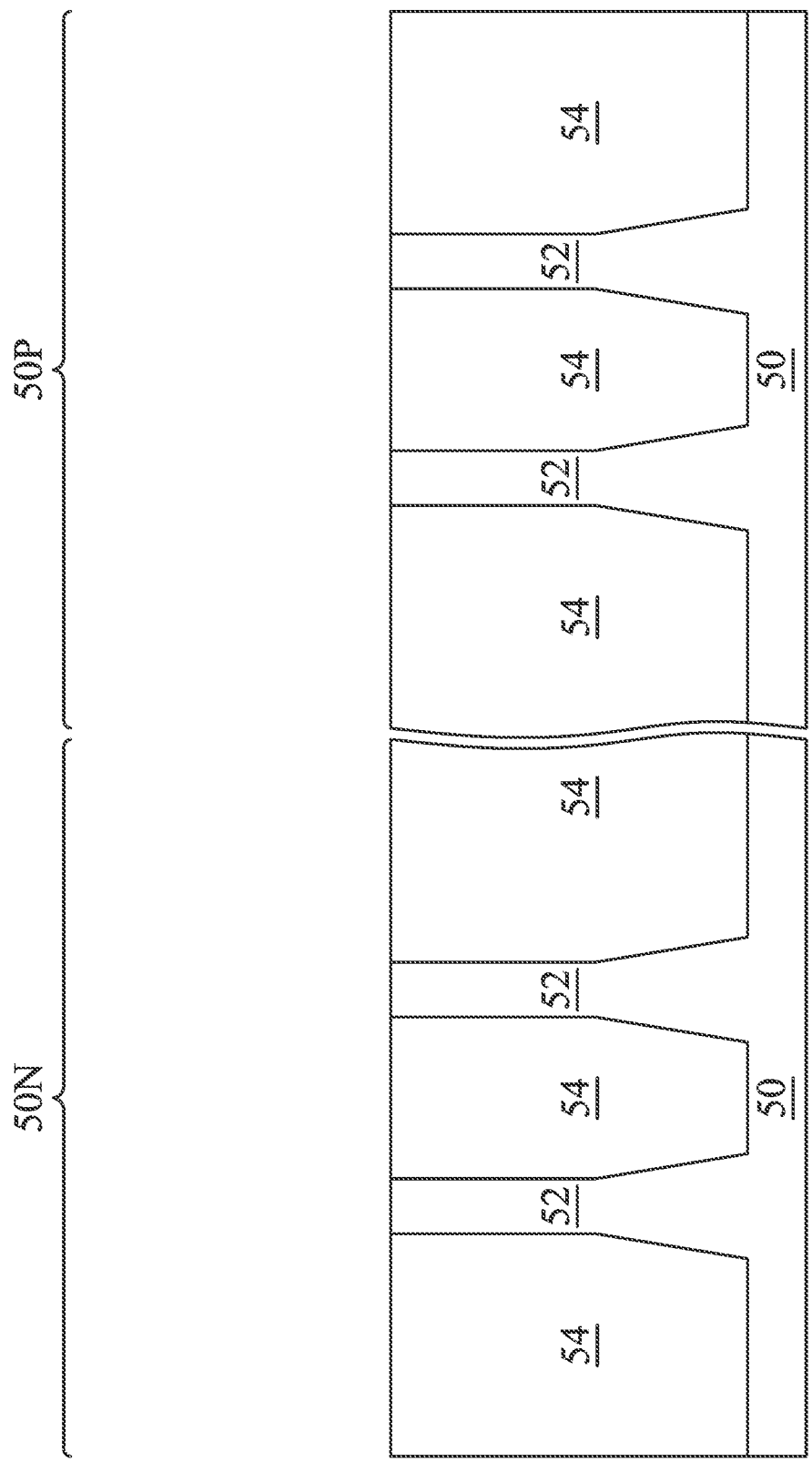

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
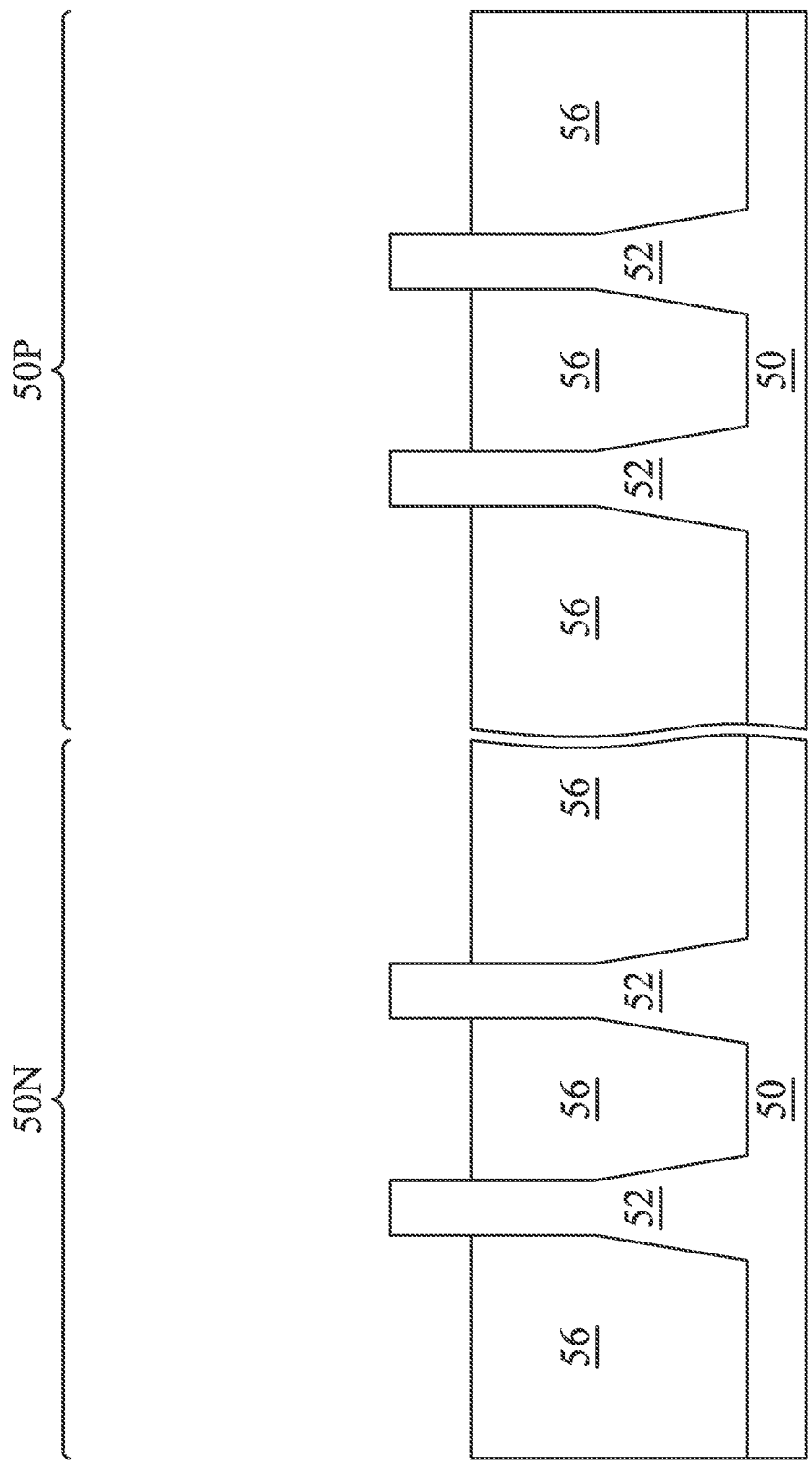

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown. The epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, BF$_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
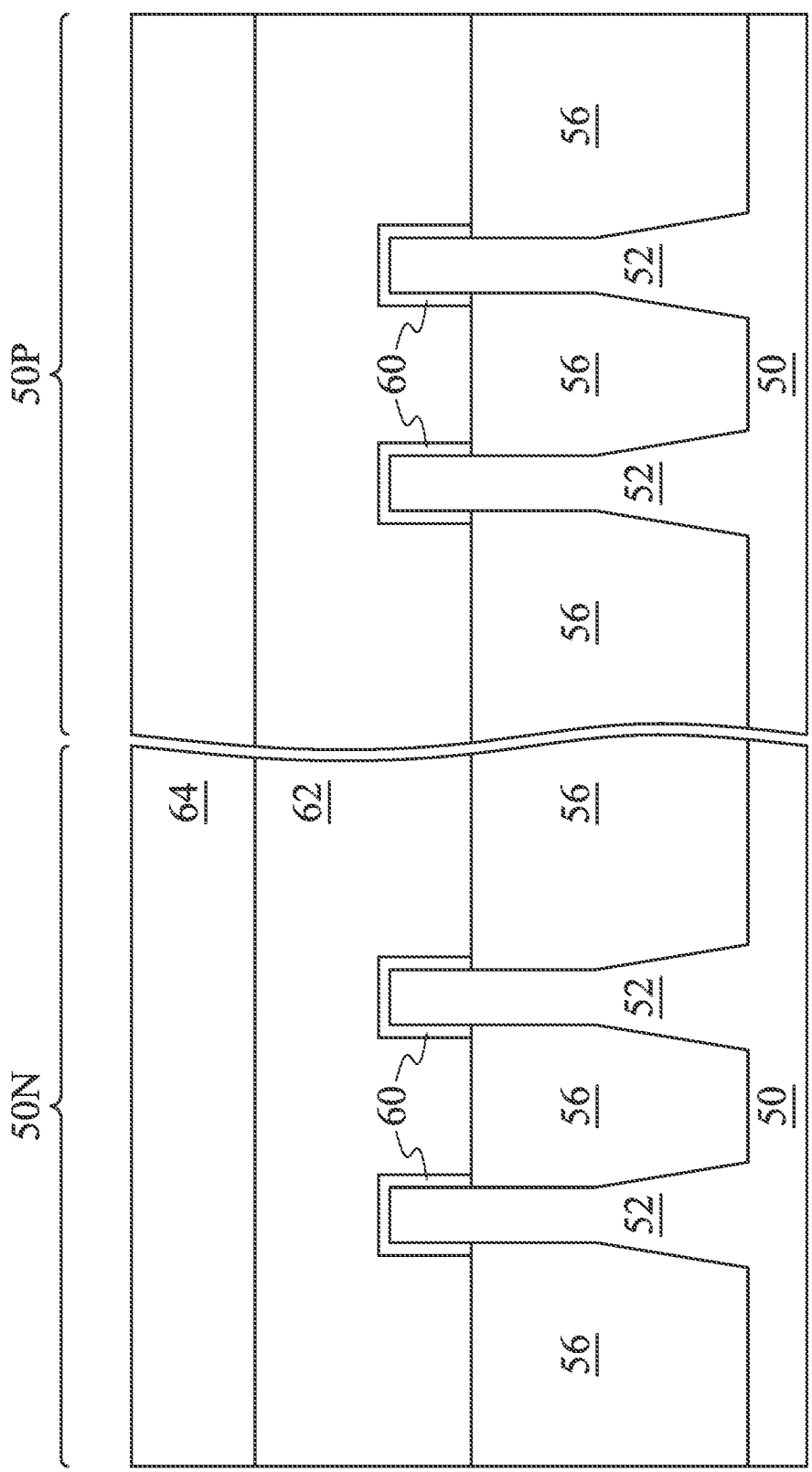

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. In some embodiments, separate dummy gate layers may be formed in the region 50N and the region 50P, and separate mask layers may be formed in the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 18B illustrate various additional steps in the manufacturing of embodiment devices. FIGS. 8A through 18B illustrate features in either of the region 50N and the region 50P. For example, the structures illustrated in FIGS. 8A through 16B may be applicable to both the region 50N and the region 50P. Differences (if any) in the structures of the region 50N and the region 50P are described in the text accompanying each figure.

In FIGS. 8A and 8B, the mask layer 64 may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., n-type or p-type) impurities may be implanted into the exposed fins 52 in the region 50P. The mask may then be removed. Subsequently, a mask, such as a photoresist, may be formed over the region 50P while exposing the region 50N, and appropriate type impurities may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 9B:
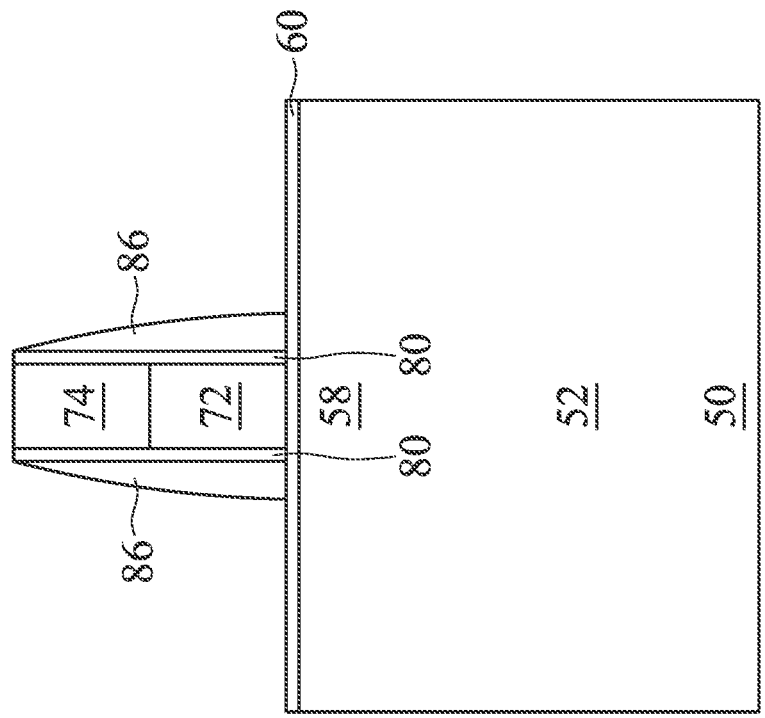
Figure 9A:
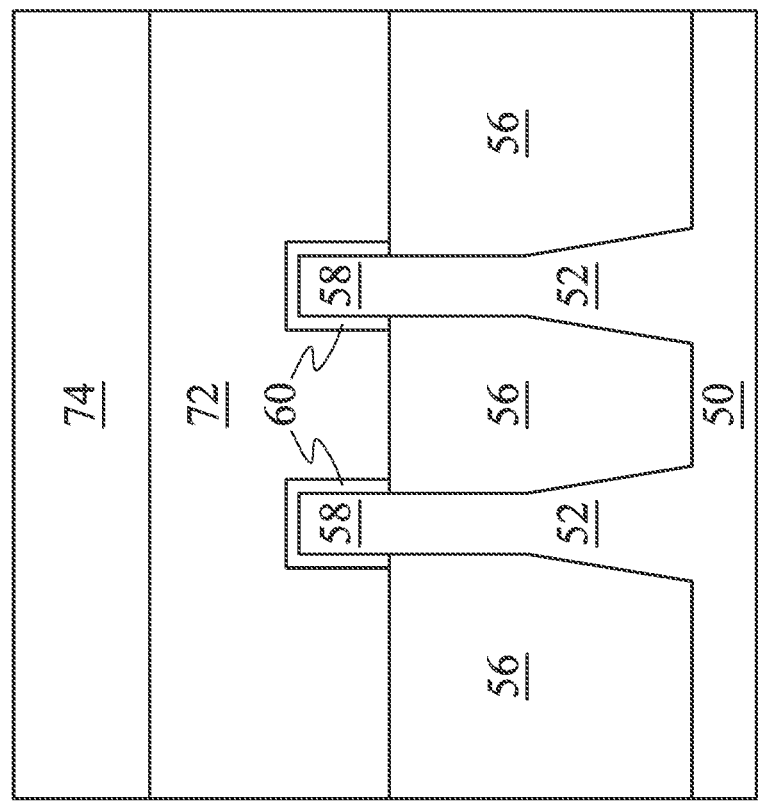

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon nitride, SiCN, a combination thereof, or the like.

Figure 10B:
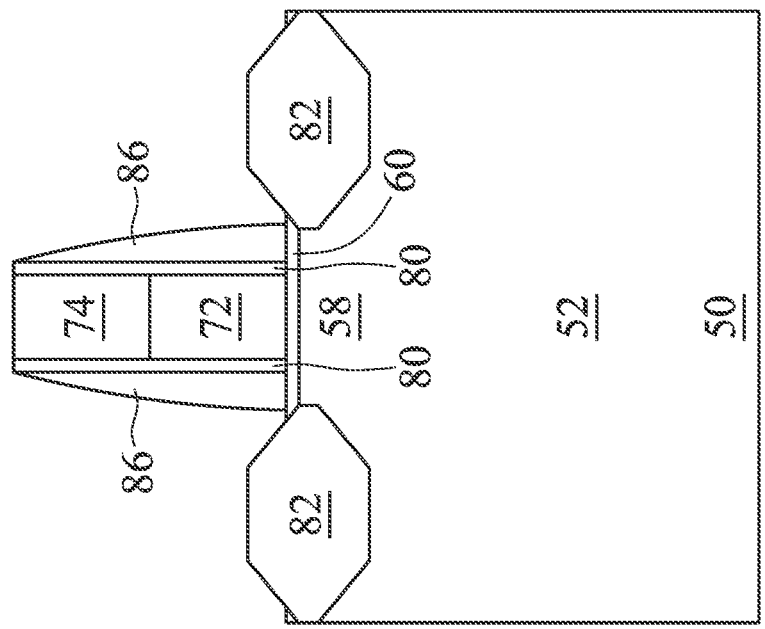
Figure 10A:
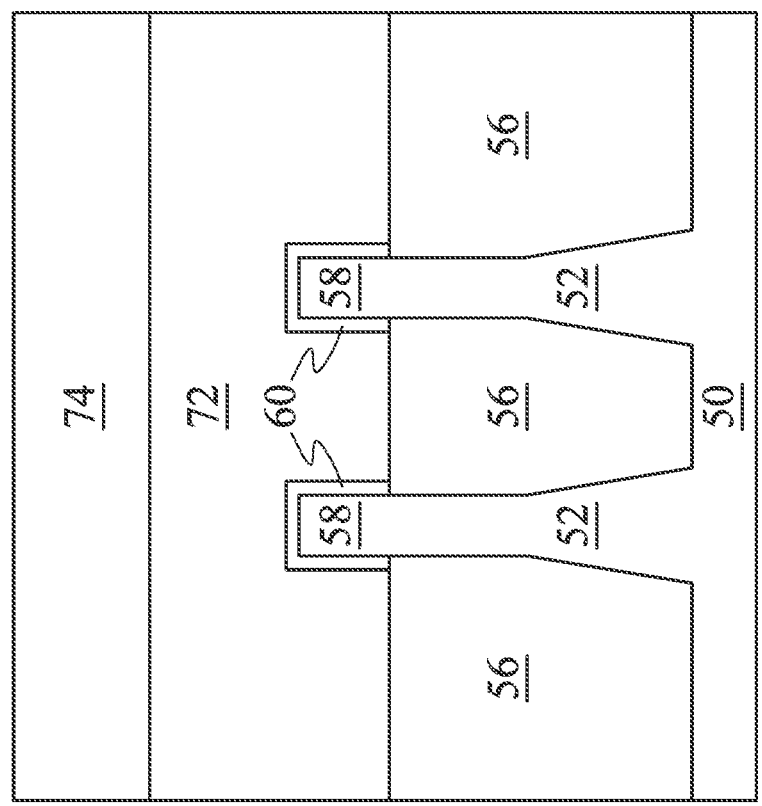
Figure 10C:
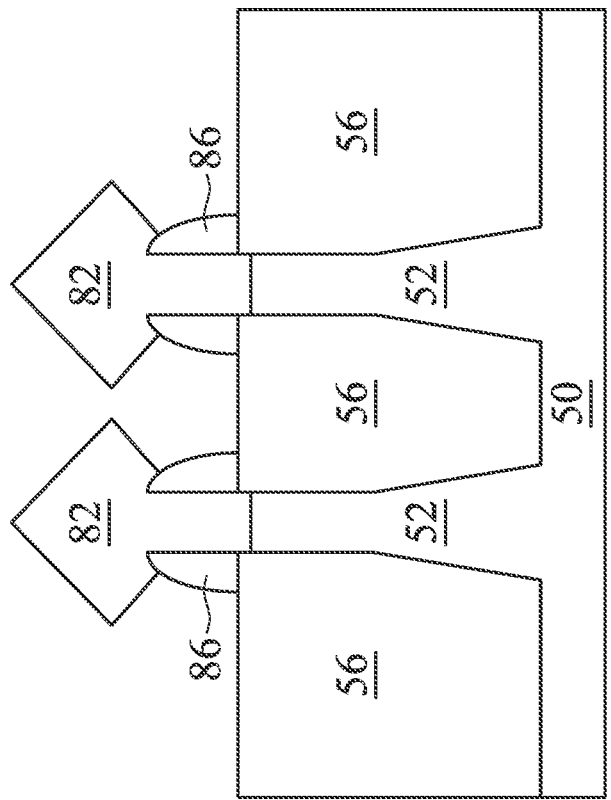
Figure 10D:
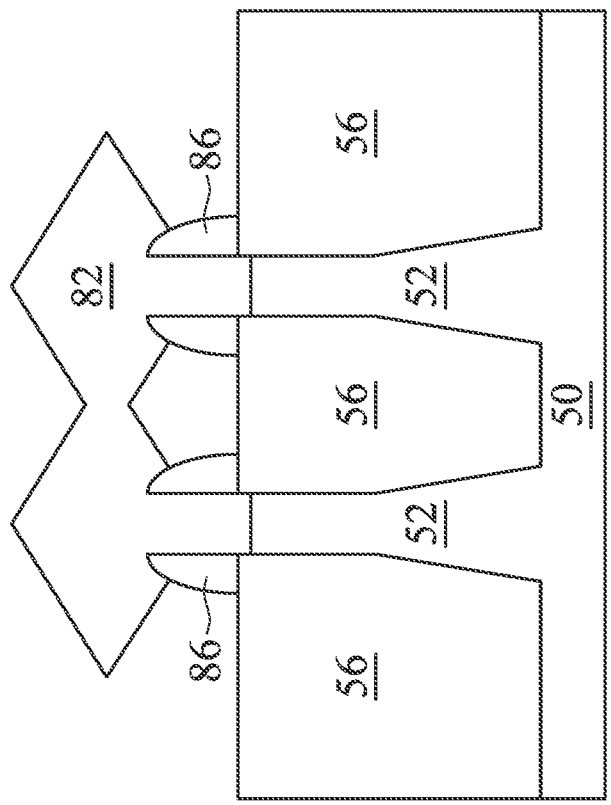

In FIGS. 10A and 10B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond a sidewalls of the fins 52. In some embodiments, these facets cause adjacent source/drain regions 82 of a same finFET to merge as illustrated by FIG. 10C. In other embodiments, adjacent source/drain regions 82 remain separated after the epitaxy process is completed as illustrated by FIG. 10D.

Figure 11B:
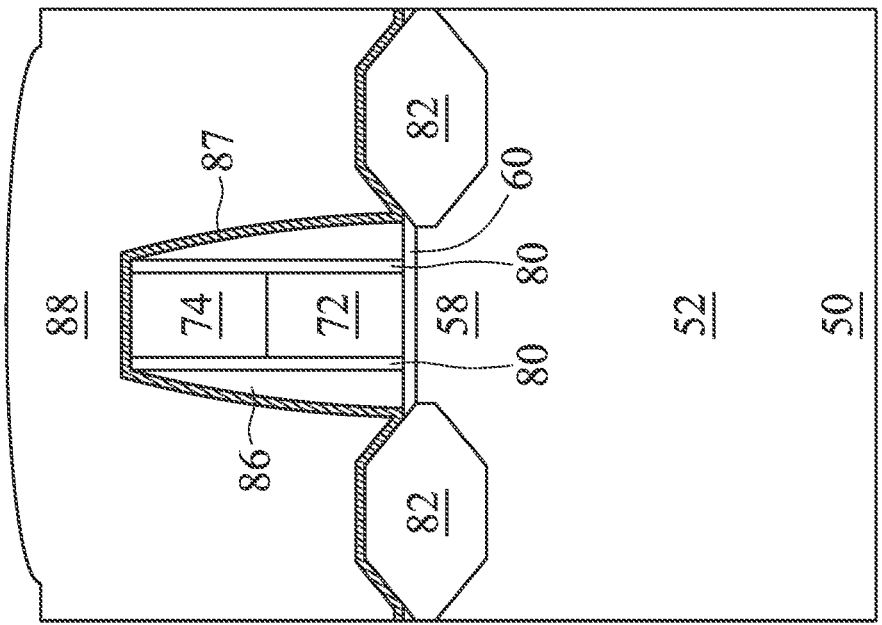
Figure 11A:
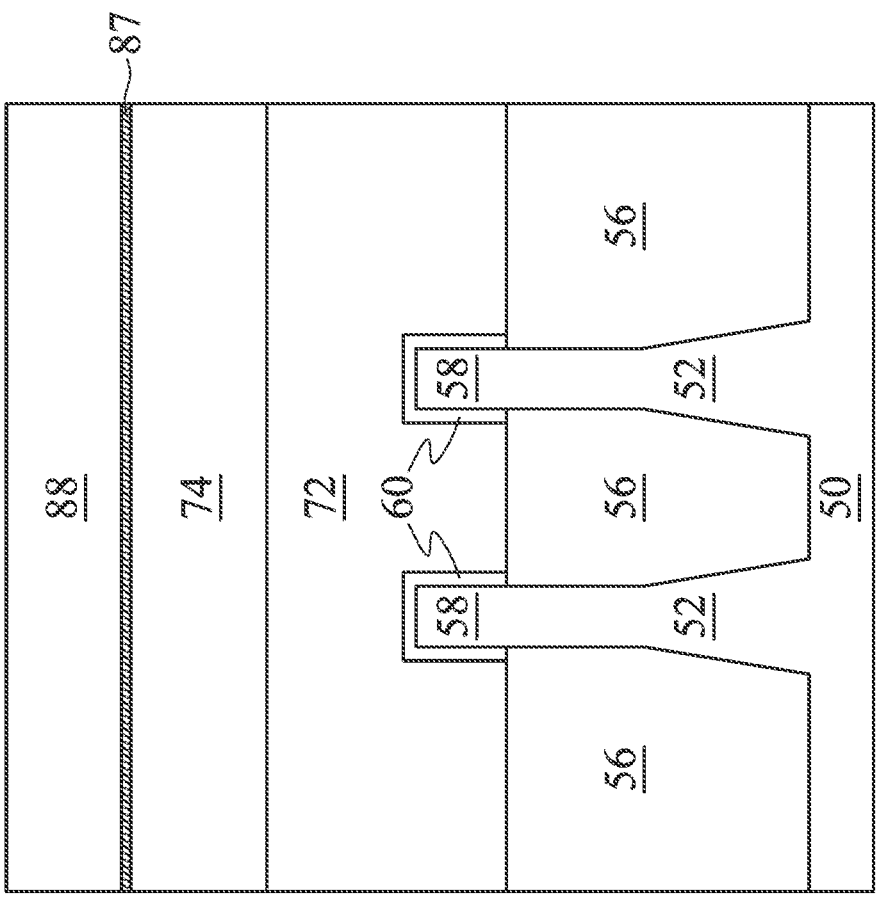

In FIGS. 11A and 11B, a first ILD 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium (Si$_x$Ge$_{1-x}$, where x can be between approximately 0 and 1), pure Germanium, or the like. Other insulation or semiconductor materials formed by any acceptable process may be used. After the deposition of the first ILD 88, a UV cure and/or an annealing process may be performed on the first ILD 88, as will be described in more detail below with regard to FIGS. 13A and 13B. In some embodiments, a contact etch stop layer (CESL) 87 is disposed between the first ILD 88 and the epitaxial source/drain regions 82, the mask 74, and the gate spacers 86. The CESL 87 may comprise a dielectric material, such as, silicon nitride, silicon oxide, silicon ox nitride, or the like, having a different etch rate than the material of the overlying first ILD 88.

Figure 12A:
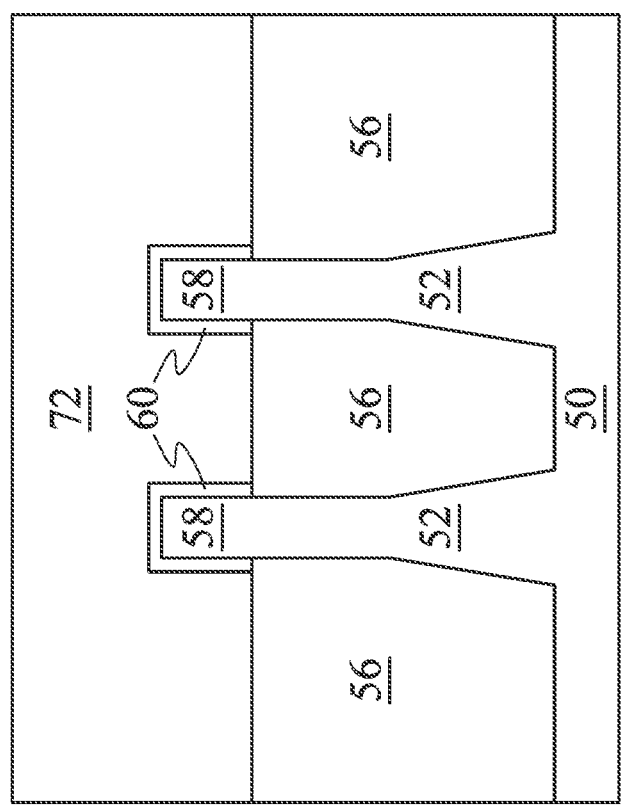
Figure 12B:
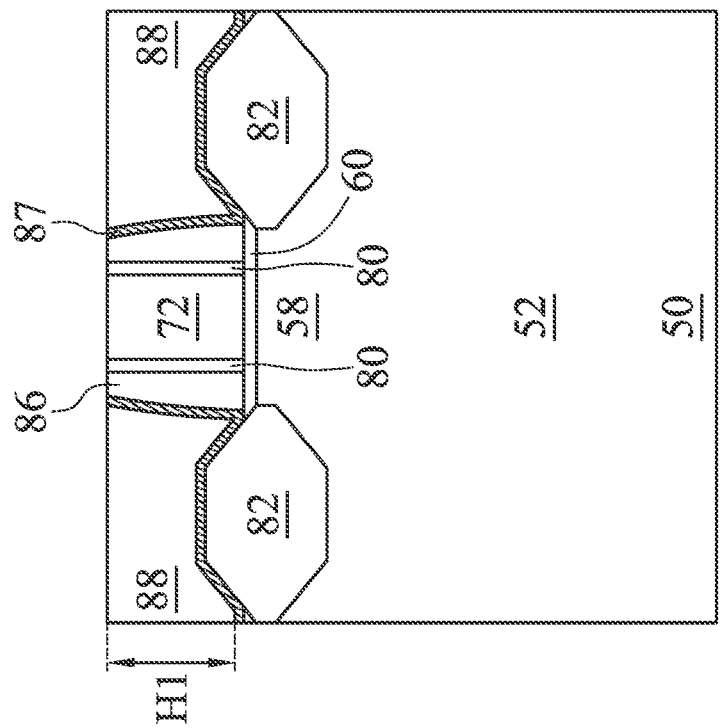

In FIGS. 12A and 12B, a planarization process, such as a CMP, may be performed to level the top surface of the first ILD 88 with the top surfaces of the dummy gates 72. The planarization process may also remove the masks 74 on the dummy gates 72, and portions of the gate seal spacers 80 and the gate spacers 86 along sidewalls of the masks 74. The planarization process may be performed in multiple steps. In an embodiment, a first planarization, such as a CMP, is performed to level the top surface of the first ILD 88 with the top surfaces of the masks 74. After the first planarization, an annealing process may be performed on the first ILD 88. The masks 74 may then be removed with an etch back process, and a second planarization may be performed to level the top surface of the first ILD 88 with the top surfaces of the dummy gates 72. After the planarization process, top surfaces of the dummy gates 72, the gate seal spacers 80, the gate spacers 86, and the first ILD 88 are level. Accordingly, the top surfaces of the dummy gates 72 are exposed through the first ILD 88.

Figure 13C:
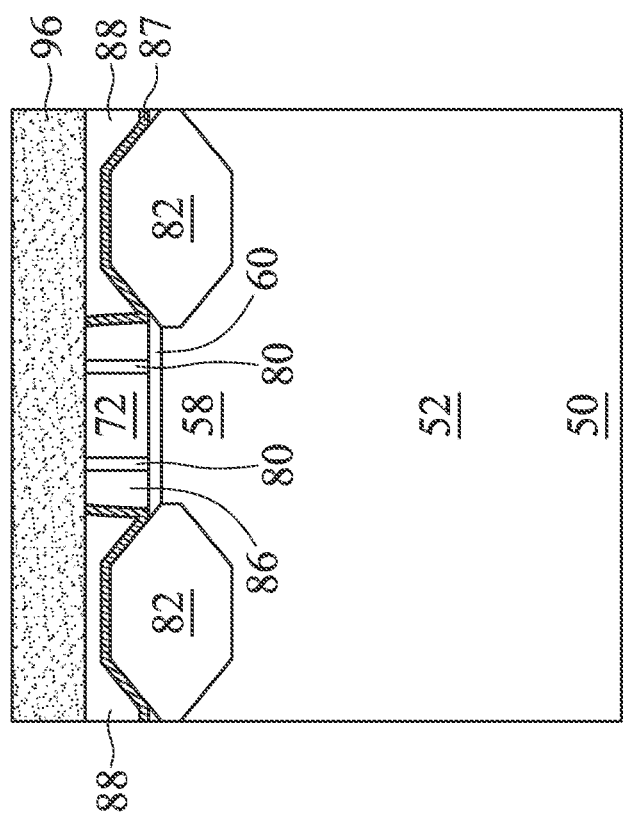

In FIGS. 13A and 13B, an implantation 102 is carried out on the first ILD 88 and on the dummy gates 72. While the precise mechanisms are not fully understood, it is believed that the implantation 102 may reduce oxygen diffusion from, for example, residue oxygen from FCVD of the first ILD 88, by causing more dangling bonds to decrease the activation energy of oxidation. The implantation 102 may be performed with a dopant of N, Ge, or Si. In an exemplary embodiment, the implantation 102 is performed with nitrogen. The implantation 102 may be performed in an energy range of about 5 KeV to about 15 KeV and at a concentration in a range of from about $1 \times 10^{15}$ cm$^{-3}$ to about $4 \times 10^{15}$ cm$^{-3}$. FIG. 13C illustrates an implanted region 96 (not illustrated in following figures) formed by the implantation 102. The dopant may be implanted in the first ILD 88 to form the implanted region 96 to a depth of between about 6% to about 19% of a vertical thickness of the first ILD 88, with a dose of between about $1 \times 10^{18}$ cm$^{-3}$ to about $1 \times 10^{21}$ cm$^{-3}$.

Figure 14B:
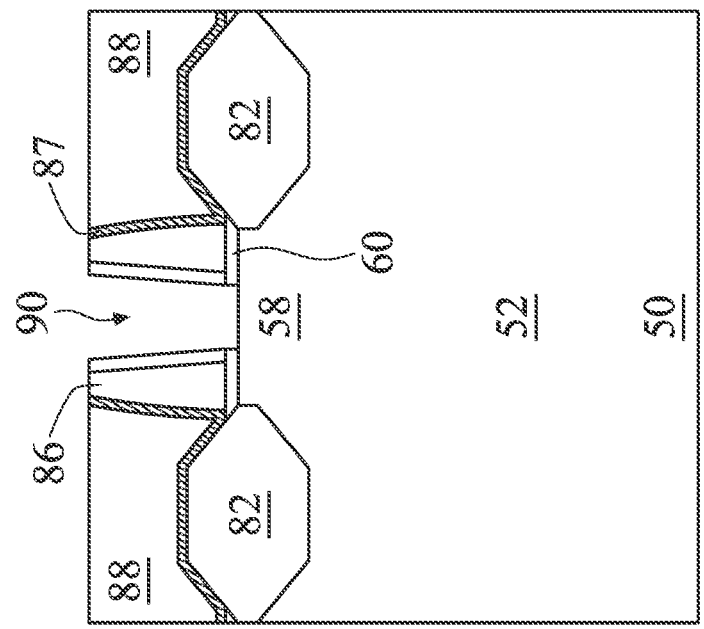
Figure 14A:
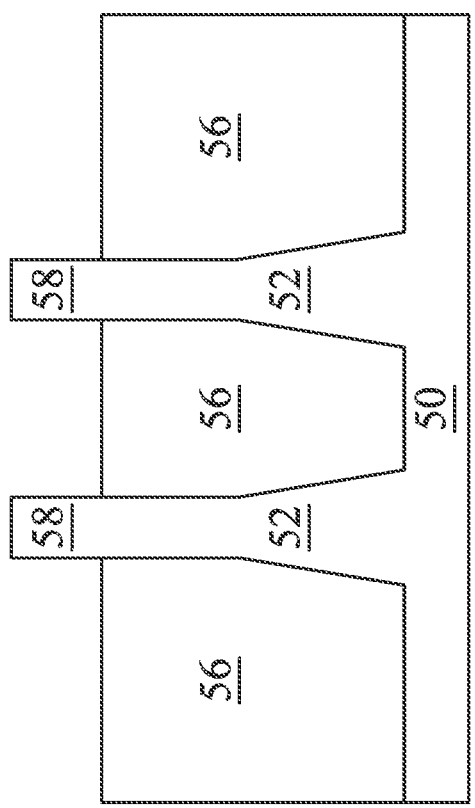

In FIGS. 14A and 14B, the dummy gates 72 are removed. The removal of the dummy gates may be performed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Reaction gas(es) used for the dry etch may be NH$_3$ and/or H$_2$. Each recess 90 exposes or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figures 15A, 15B:
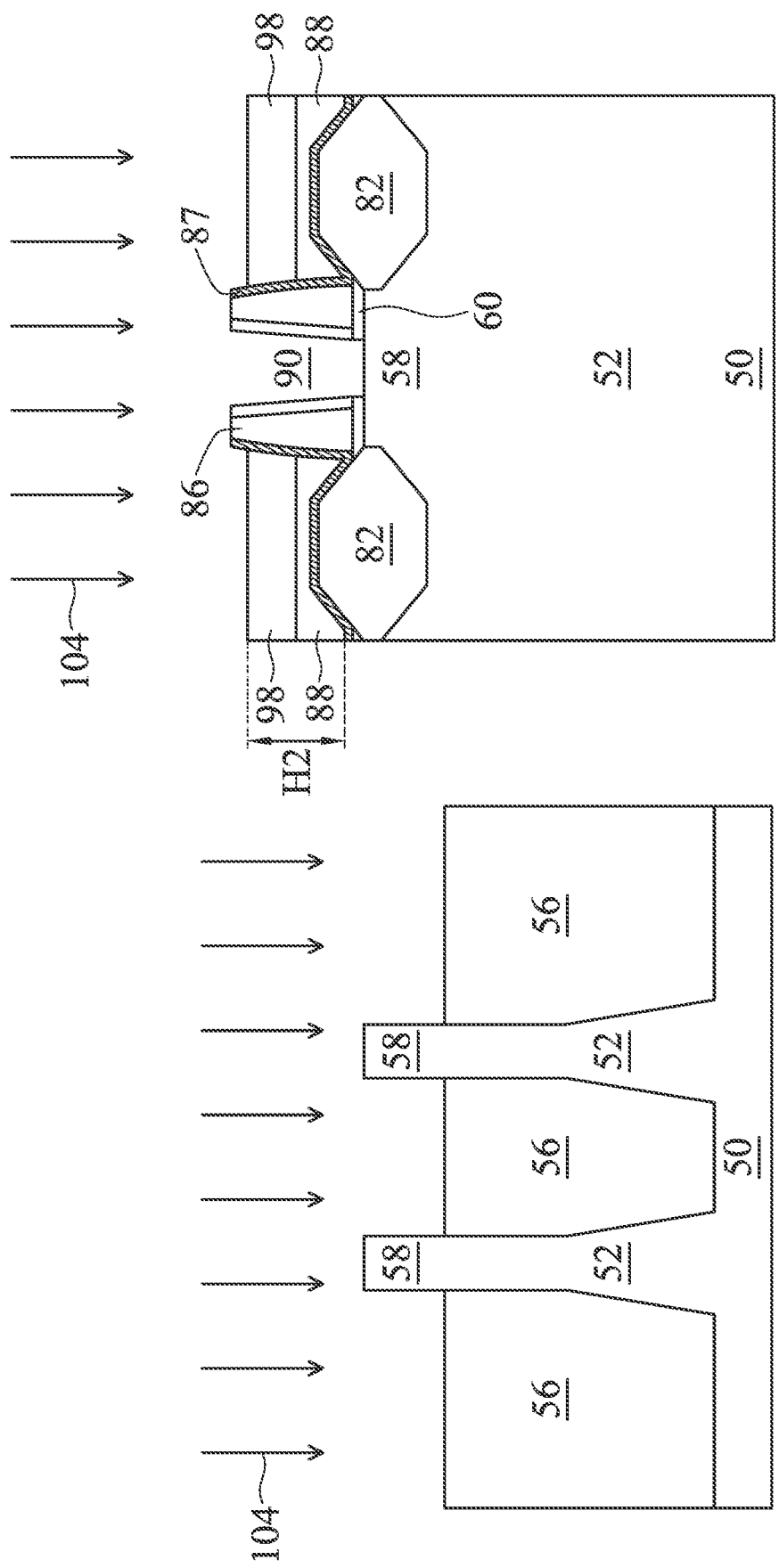

In FIGS. 15A and 15B, an anneal 104 is performed on the first ILD 88. The anneal 104 may be a furnace anneal. The anneal 104 may be performed using N$_2$, NH$_3$, or Ar, among other flow gases. In an exemplary embodiment, the anneal 104 is a furnace anneal performed with N$_2$. The anneal 104 may be performed at a temperature between about 600° C. to about 800° C., for a time period between about 100 minutes and about 150 minutes. The anneal 104 causes Si—O reactions and oxygen out-diffusing in a thermally activated region 98 of the first ILD 88 as illustrated in FIG. 15B, which reduces oxygen diffusion from the first ILD 88 into the fins 52. As the dummy gates 72 have been removed and so cannot resist a shrinkage, the reduction in the amount of oxygen in the first ILD 88 after the implantation 102 and the anneal 104 will cause a shrinkage of the thermally activated region 98 of the first ILD 88. The vertical thickness of the first ILD 88 may decrease from a vertical thickness of H$_1$ as shown in FIG. 12B to a vertical thickness of H$_2$ as shown in FIG. 15B. The ratio of H$_2$ to H$_1$ may be between about 87.5% and about 96.25%.

Figure 16B:
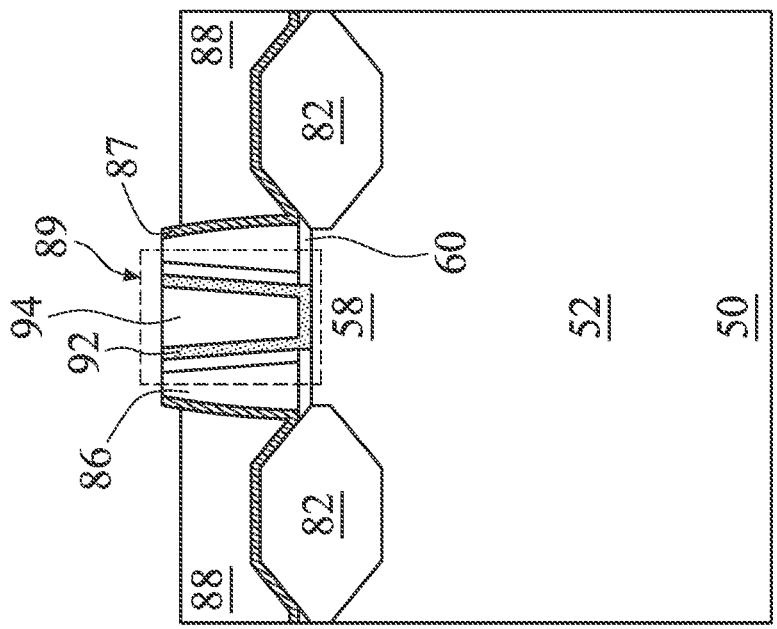
Figure 16A:
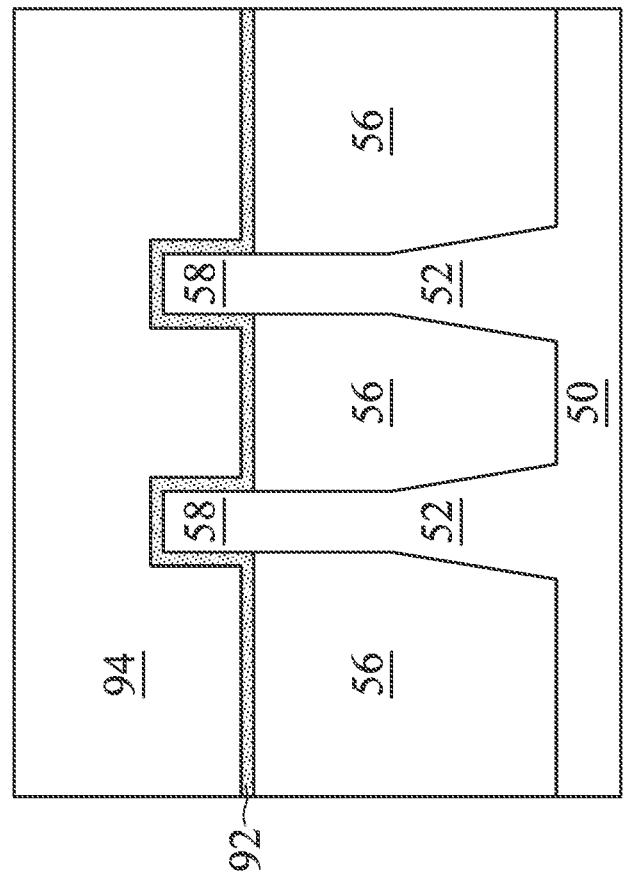
Figure 16D:
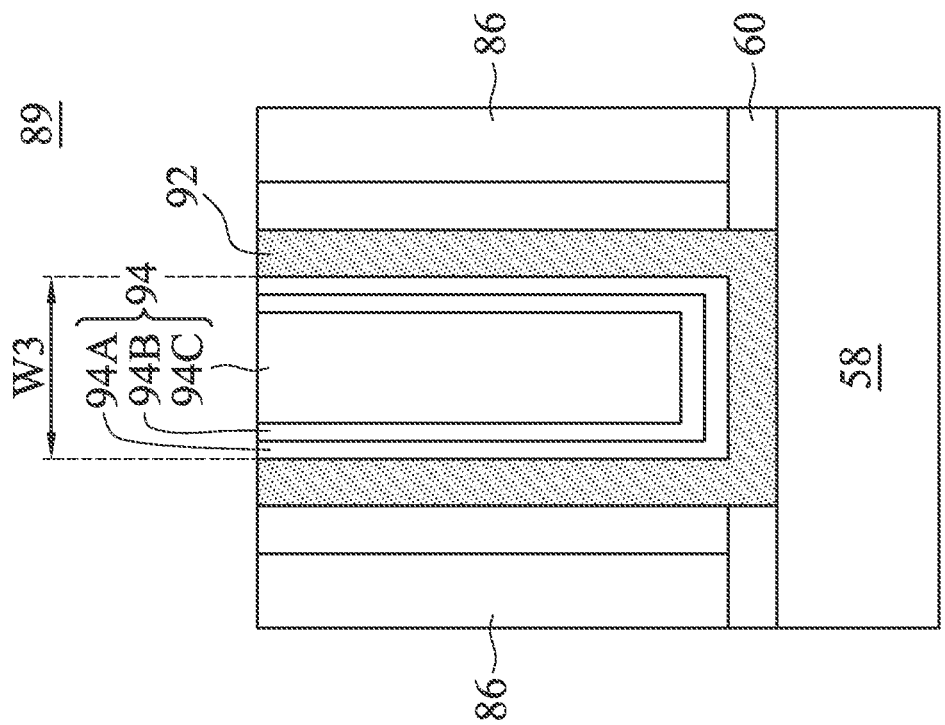
Figure 16C:
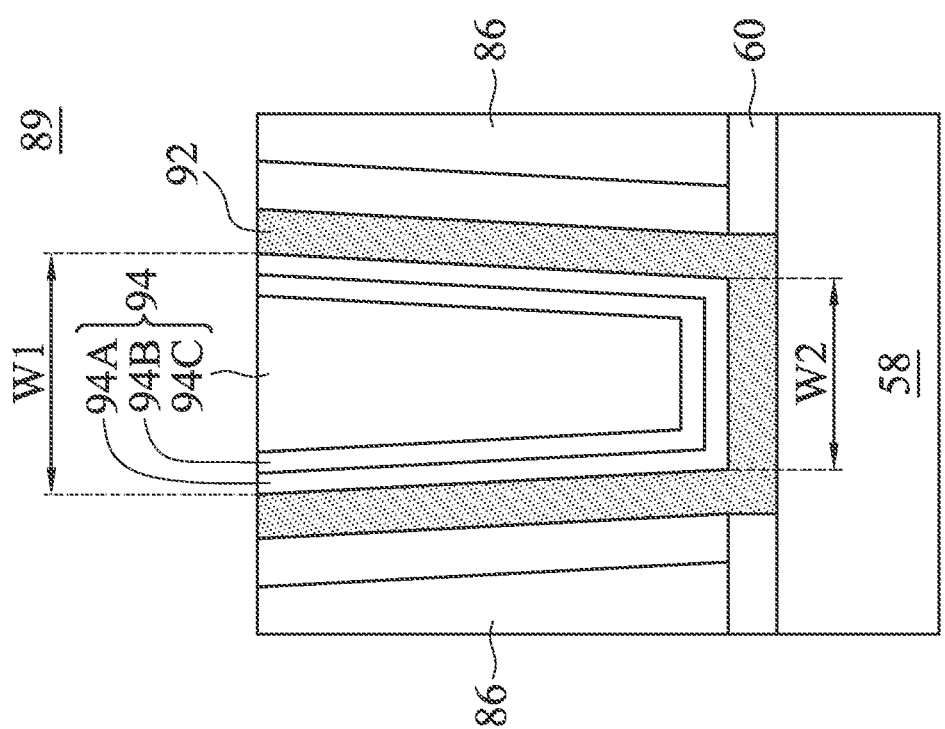

In FIGS. 16A and 16B, gate dielectric layers 92 and gate electrodes 94 are formed for replacement gates. FIG. 16C illustrates a detailed view of region 89 of FIG. 16B, while FIG. 16D illustrates a detailed view of region 89 in which the implantation 102 and the anneal 104 were not performed. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on top surface of the first ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., SiO).

The gate electrodes 94 are deposited over the gate dielectric layers 92, respectively, and fill the remaining portions of the recesses 90. The gate electrodes 94 may be a metal-containing material such as TiN, TiO, TaN, TaC, Co, Ru, Al, W, combinations thereof, or multilayers thereof. For example, although a single layer gate electrode 94 is illustrated in FIG. 16B, the gate electrode 94 may comprise any number of liner layers 94A, any number of work function tuning layers 94B, and a fill material 94C as illustrated by FIG. 16C. After the filling of the gate electrodes 94, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The gate electrodes 94 may have a top width W$_1$ as illustrated in FIG. 16C greater than a bottom width W$_2$ of the gate electrodes 94 as illustrated FIG. 16C, and the top width W$_1$ may be greater than a top width W$_3$ as illustrated in FIG. 16D for a process in which the implantation 102 and the anneal 104 were not performed. The ratio of W$_2$ to W$_1$ may be between about 88% and about 97%. The ratio of W$_3$ to W$_1$ may be between about 92% and about 98%. This increase in critical dimension of the gate stack may lead to an increase of volume of the metal-containing material of the gate electrodes 94 of between about 110% and about 120%.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 17B:
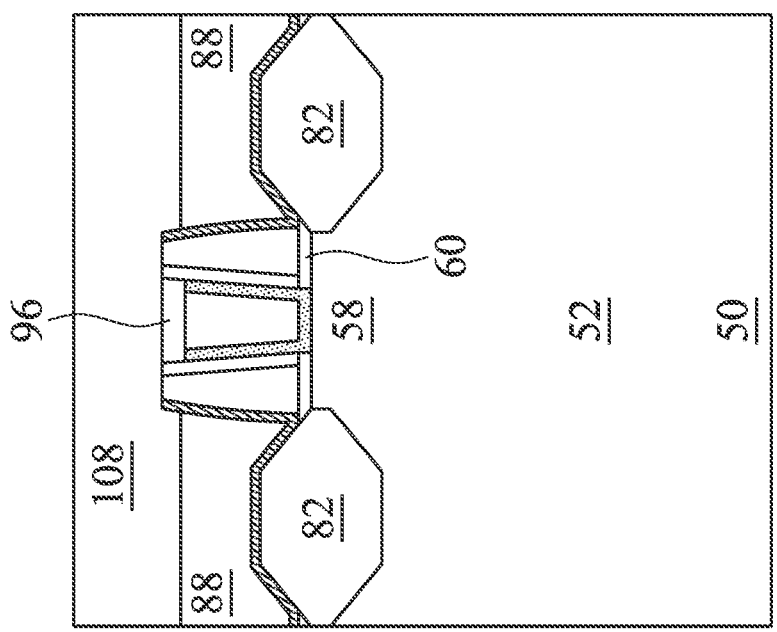
Figure 17A:
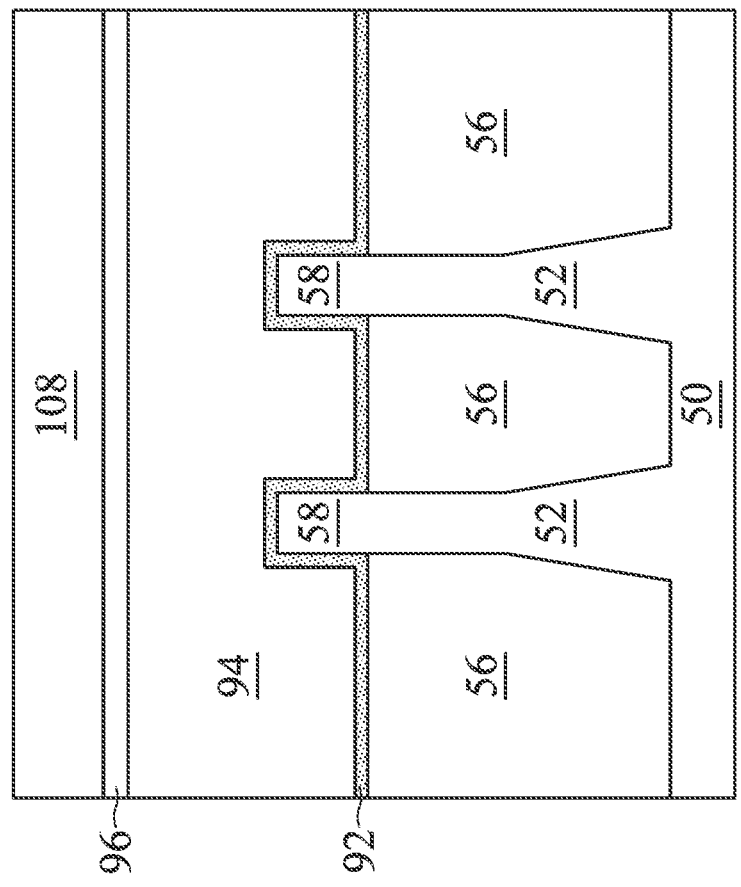

In FIGS. 17A and 17B, a second ILD 108 is deposited over the first ILD 88. In an embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD.

Figure 18A:
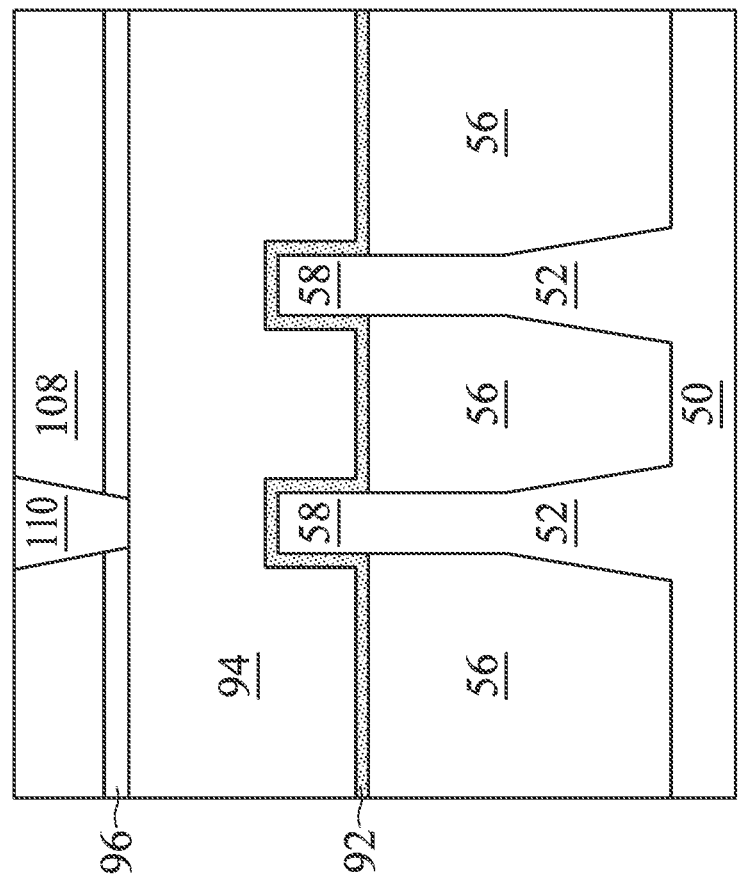
Figure 18B:
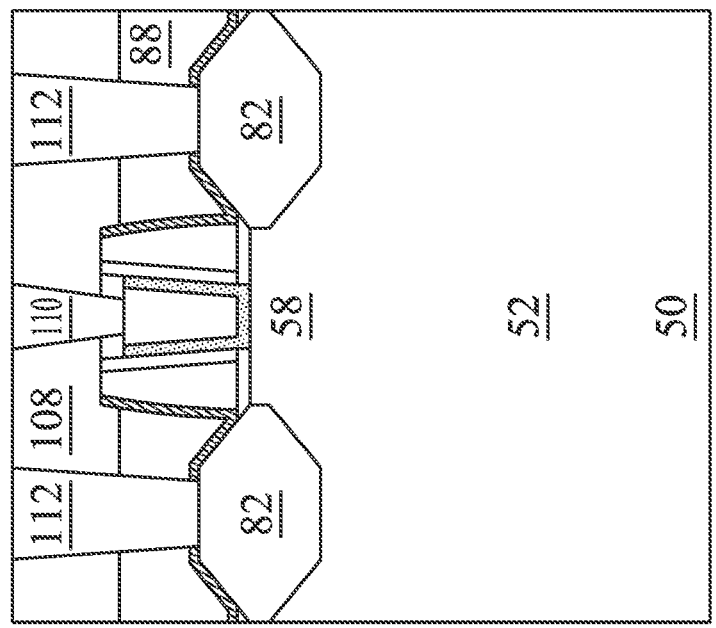

In FIGS. 18A and 18B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The addition of an implantation prior to the dummy gate removal and an anneal subsequent to the dummy gate removal leads to an enhancement of channel resistance by a reduction in interlayer dielectric thickness and to an enlargement of critical dimensions of the metal gate by strain engineering. This may boost device performance by decreasing parasitic resistance with the increased amount of metallic material filling the gate while also enhancing the on current by reducing the interlayer dielectric thickness. This method is applicable to PFET and NFET devices.

In an embodiment, a method of manufacturing a device includes: forming a dummy gate on a semiconductor substrate; forming an interlayer dielectric (ILD) over the semiconductor substrate; implanting a dopant into the ILD; after implanting the dopant, removing the dummy gate; and after removing the dummy gate, performing an anneal on the ILD. In an embodiment, the implanting is performed at an energy of between about 5 KeV and about 15 KeV. In an embodiment, the anneal is performed using $N_2$ as the flow gas. In an embodiment, the anneal is performed at a temperature of between about 600° C. and about 800° C. In an embodiment, the anneal is performed for a time period between about 100 minutes and 150 minutes. In an embodiment, the dopant includes nitrogen. In an embodiment, the implantation is performed such that the concentration of nitrogen in the ILD is between about $1\times10^{18}$ cm$^{-3}$ to about $1\times10^{21}$ cm$^{-3}$. In an embodiment, the implantation and the anneal are performed so that the nitrogen is distributed in the ILD to a depth of between about 5 nm to about 15 nm.

In accordance with another embodiment, a method of manufacturing a device includes: forming a fin on a substrate; forming a dummy gate over the fin; forming a mask on the dummy gate; forming an interlayer dielectric (ILD) over the fin and mask with a flowable chemical vapor deposition (FCVD); performing a UV cure on the ILD; performing a first anneal on the ILD; leveling the ILD with a top surface of the mask; performing a second anneal on the ILD; removing the mask; leveling the ILD with a top surface of the dummy gate; performing a nitrogen implantation on the ILD; removing the dummy gate; performing a third anneal on the ILD; forming a gate dielectric in a recess left by removing the dummy gate; and depositing a gate electrode over the gate dielectric. In an embodiment, the nitrogen implantation is performed at an energy of between about 5 KeV and about 15 KeV. In an embodiment, the third anneal is performed with $N_2$ at a temperature of below 900° C. In an embodiment, the third anneal is performed with $N_2$ for a time period between about 100 minutes and 150 minutes. In an embodiment, the nitrogen implantation is performed such that the concentration of nitrogen in the ILD is between about $1\times10^{18}$ cm$^{-3}$ to about $1\times10^{21}$ cm$^{-3}$. In an embodiment, performing the nitrogen implantation and the third anneal cause a vertical thickness of the ILD to contract to between about 80% and about 90% of its original vertical thickness. In an embodiment, performing the nitrogen implantation and the third anneal cause a top width of the gate electrode to be greater than a bottom width of the gate electrode by a ratio of between about 105% and about 110%. In an embodiment, the nitrogen implantation and the third anneal are performed so that the nitrogen is distributed in the ILD to a depth of between about 5 nm to about 15 nm.

In accordance with yet another embodiment, a device includes: a substrate having a fin; a metal gate on the fin with a first width measured at a top surface of the metal gate and a second width measured at a bottom surface of the metal gate so that the top width is greater than the bottom width by a ratio of between about 110% and about 115%; and an interlayer dielectric (ILD) over the fin, so that a top surface of the ILD is level with the top surface of the metal gate and the ILD is doped with nitrogen to a depth between about 37.5% and about 62.5% of a vertical thickness of the ILD. In an embodiment, the vertical thickness of the ILD is between about 30 nm and about 50 nm. In an embodiment, the device may be a PFET or an NFET. In an embodiment, the ILD has a nitrogen dopant dose of between about $1\times10^{18}$ cm$^{-3}$ to about $1\times10^{21}$ cm$^{-3}$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a device, the method comprising:
   forming a dummy gate on a semiconductor substrate;
   depositing a mask on the dummy gate;
   forming an interlayer dielectric (ILD) over the semiconductor substrate;
   performing a first planarization on the ILD, a top surface of the ILD being level with a top surface of the mask after the first planarization;
   removing the mask;
   performing a second planarization on the ILD, a top surface of the ILD being level with a top surface of the dummy gate after the second planarization;
   implanting a dopant into the ILD;
   after implanting the dopant, removing the dummy gate; and
   after removing the dummy gate, performing an anneal on the ILD.

2. The method of claim 1, wherein the implanting is performed at an energy of between about 5 KeV and about 15 KeV.

3. The method of claim 1, wherein the anneal is performed using $N_2$ as a flow gas.

4. The method of claim 1, wherein the anneal is performed at a temperature of between about 600° C. and about 800° C.

5. The method of claim 1, wherein the anneal is performed for a time period between about 100 minutes and 150 minutes.

6. The method of claim 1, wherein the dopant comprises nitrogen.

7. The method of claim 6, wherein implanting the dopant is performed such that the concentration of nitrogen in the ILD is between about $1\times10^{18}$ cm$^{-3}$ to about $1\times10^{21}$ cm$^{-3}$.

8. The method of claim 6, wherein the implanting the dopant and the anneal are performed such that the nitrogen is distributed in the ILD to a depth of between about 5 nm to about 15 nm.

9. A method of manufacturing a device, the method comprising:
   forming a fin on a substrate;
   forming a dummy gate over the fin;
   forming a mask on the dummy gate;

forming an interlayer dielectric (ILD) over the fin and mask with a flowable chemical vapor deposition (FCVD);
performing a UV cure on the ILD;
performing a first anneal on the ILD;
leveling the ILD with a top surface of the mask;
performing a second anneal on the ILD;
removing the mask;
leveling the ILD with a top surface of the dummy gate;
performing a nitrogen implantation on the ILD;
removing the dummy gate;
performing a third anneal on the ILD;
forming a gate dielectric in a recess left by removing the dummy gate; and
depositing a gate electrode over the gate dielectric.

10. The method of claim 9, wherein the nitrogen implantation is performed at an energy of between about 5 KeV and about 15 KeV.

11. The method of claim 9, wherein the third anneal is performed with $N_2$ at a temperature of below 900° C.

12. The method of claim 9, wherein the third anneal is performed with $N_2$ for a time period between about 100 minutes and 150 minutes.

13. The method of claim 9, wherein the nitrogen implantation is performed such that the concentration of nitrogen in the ILD is between about $1\times10^{18}$ cm$^{-3}$ to about $1\times10^{21}$ cm$^{-3}$.

14. The method of claim 9, such that performing the nitrogen implantation and the third anneal cause a vertical thickness of the ILD to contract to between about 80% and about 90% of its original vertical thickness.

15. The method of claim 9, such that performing the nitrogen implantation and the third anneal cause a top width of the gate electrode to be greater than a bottom width of the gate electrode by a ratio of between about 110% and about 115%.

16. The method of claim 9, wherein the nitrogen implantation and the third anneal are performed such that the nitrogen is distributed in the ILD to a depth of between about 5 nm to about 15 nm.

17. A method of manufacturing a device, the method comprising:
forming a dummy gate structure over a fin, the fin extending from a semiconductor substrate;
forming a mask over the dummy gate structure;
depositing a dielectric layer over the mask, the dummy gate structure and the fin;
planarizing the dielectric layer to be level with a top surface of the mask;
performing a first anneal on the dielectric layer;
performing an etch back process, the etch back process removing the mask;
planarizing the dielectric layer to be level with a top surface of the dummy gate structure;
implanting nitrogen into the dielectric layer;
removing the dummy gate structure to form a first recess;
after removing the dummy gate structure, performing a second anneal on the dielectric layer; and
forming a gate electrode in the first recess.

18. The method of claim 17, wherein the dielectric layer has a vertical thickness in a range of 30 nm to 50 nm after the second anneal.

19. The method of claim 17, wherein after implanting the nitrogen, the dielectric layer has a nitrogen dopant dose of between about $1\times10^{18}$ cm$^{-3}$ to about $1\times10^{21}$ cm$^{-3}$.

20. The method of claim 17, wherein the gate electrode has a first width measured across a top surface of the gate electrode, the gate electrode has a second width measured across a bottom surface of the gate electrode, and a ratio of the second width to the first width is in a range of 88% and 97%.

* * * * *